US012635335B2

(12) United States Patent
Duan et al.

(10) Patent No.: US 12,635,335 B2
(45) Date of Patent: May 19, 2026

(54) METHODS FOR PREPARING OPTICAL INK, METHODS FOR PREPARING MONODISPERSE SOLUTION OF ZIRCONIUM DIOXIDE, AND DISPLAY DEVICES

(71) Applicant: SHENZHEN CHINA STAR OPTOELECTRONICS SEMICONDUCTOR DISPLAY TECHNOLOGY CO., LTD., Guangming New District Shenzhen (CN)

(72) Inventors: Miao Duan, Guangming New District Shenzhen (CN); Miao Zhou, Guangming New District Shenzhen (CN); Lixuan Chen, Guangming New District Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 661 days.

(21) Appl. No.: 18/081,425

(22) Filed: Dec. 14, 2022

(65) Prior Publication Data

US 2024/0164137 A1 May 16, 2024

(30) Foreign Application Priority Data

Nov. 14, 2022 (CN) .......................... 202211419817.3

(51) Int. Cl.
*H10K 50/858* (2023.01)
*C01G 25/02* (2006.01)
(Continued)

(52) U.S. Cl.
CPC ........... *H10K 50/858* (2023.02); *C01G 25/02* (2013.01); *C09D 11/023* (2013.01);
(Continued)

(58) Field of Classification Search
CPC .... H10K 50/858; C01G 25/02; C09D 11/023; C09D 11/033; C09D 11/037; C09D 11/101; C01P 2006/60
See application file for complete search history.

(56) References Cited

FOREIGN PATENT DOCUMENTS

| | | | | | |
|---|---|---|---|---|---|
| CN | 108529674 A | * | 9/2018 | ............. | B82Y 30/00 |
| CN | 110577241 A | * | 12/2019 | ............. | B82Y 40/00 |
| CN | 111434380 A | * | 7/2020 | ............. | B01J 23/83 |
| CN | 112852163 A | | 5/2021 | | |

(Continued)

OTHER PUBLICATIONS

Machine English translation of Wang, Jie-xin, CN-110577241-A, Dec. 17, 2019. (Year: 2019).*

(Continued)

*Primary Examiner* — Coris Fung
*Assistant Examiner* — Caroline D. Liott
(74) *Attorney, Agent, or Firm* — PV IP PC; Peter Stecher; Wei Te Chung

(57) ABSTRACT

Provided are methods for preparing optical ink, methods for preparing a monodisperse solution of zirconium dioxide, and display devices. A corresponding zirconium dioxide hydrosol is prepared by an aqueous solution method, and reactants are added to the zirconium dioxide hydrosol for multi-step reactions to obtain a transparent modified nano zirconium dioxide disperse solution. Then monomer, photoinitiator, solvent, and other functional additive are added to the nano zirconium dioxide disperse solution to obtain optical ink of the desired specification.

13 Claims, 3 Drawing Sheets

(51) Int. Cl.

| | | |
|---|---|---|
| *C09D 11/023* | (2014.01) | |
| *C09D 11/033* | (2014.01) | |
| *C09D 11/037* | (2014.01) | |
| *C09D 11/101* | (2014.01) | |

(52) U.S. Cl.
CPC .......... *C09D 11/033* (2013.01); *C09D 11/037* (2013.01); *C01P 2006/60* (2013.01)

(56) References Cited

FOREIGN PATENT DOCUMENTS

| | | | | | |
|---|---|---|---|---|---|
| CN | 115044250 | A | | 9/2022 | |
| KR | 20140078995 | A | * | 6/2014 | ............. C01G 25/02 |
| TW | I760244 | B | * | 4/2022 | ............. C01G 25/02 |

OTHER PUBLICATIONS

Machine English translation of Yamaguchi Jun, KR-20140078995-A, Jun. 26, 2014. (Year: 2014).*

Machine English translation of Song, Xibin, TW-I760244-B, Apr. 1, 2022. (Year: 2022).*

Machine English translation of Pu, Yuan, CN-108529674-A, Sep. 14, 2018. (Year: 2018).*

Machine English translation of Wang, Jie-xin, CN-111434380-A, Jul. 21, 2020. (Year: 2020).*

Chinese Office Action issued in corresponding Chinese Patent Application No. 202211419817.3 dated May 31, 2023, pp. 1-13.

Xue, Rujun et al., "Surface modification and physical properties of inorganic nanomaterials", Hefei University of Technology Press, Oct. 31, 2009, p. 123, 1st edition.

* cited by examiner

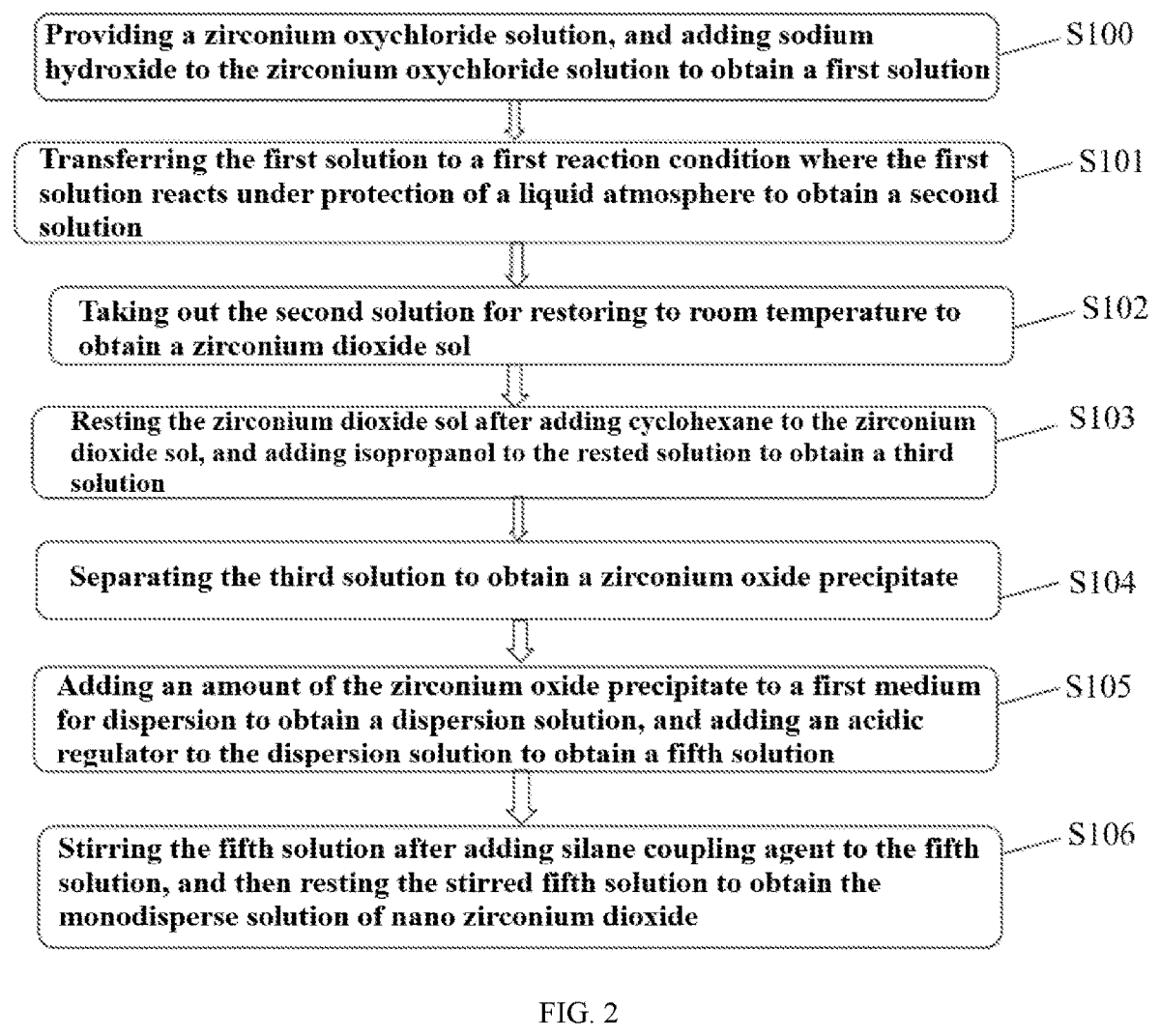

Providing a zirconium oxychloride solution, and adding sodium hydroxide to the zirconium oxychloride solution to obtain a first solution    ⟋ S100

Transferring the first solution to a first reaction condition where the first solution reacts under protection of a liquid atmosphere to obtain a second solution    ⟋ S101

Taking out the second solution for restoring to room temperature to obtain a zirconium dioxide sol    ⟋ S102

Resting the zirconium dioxide sol after adding cyclohexane to the zirconium dioxide sol, and adding isopropanol to the rested solution to obtain a third solution    ⟋ S103

Separating the third solution to obtain a zirconium oxide precipitate    ⟋ S104

Adding an amount of the zirconium oxide precipitate to a first medium for dispersion to obtain a dispersion solution, and adding an acidic regulator to the dispersion solution to obtain a fifth solution    ⟋ S105

Stirring the fifth solution after adding silane coupling agent to the fifth solution, and then resting the stirred fifth solution to obtain the monodisperse solution of nano zirconium dioxide    ⟋ S106

FIG. 2

Providing a monodisperse solution of zirconium dioxide that is prepared by the method provided in embodiments of the present disclosure — S201

Adding monomer, photoinitiator, solvent, and functional additive to the monodisperse solution of zirconium dioxide, to obtain the optical ink — S202

METHODS FOR PREPARING OPTICAL INK, METHODS FOR PREPARING MONODISPERSE SOLUTION OF ZIRCONIUM DIOXIDE, AND DISPLAY DEVICES

CROSS-REFERENCE TO RELATED APPLICATIONS

This application claims the benefit of Chinese Patent Application No. 202211419817.3, filed on Nov. 14, 2022. The entire disclosure of the above application is incorporated herein by reference.

FIELD

The present disclosure relates to display panel manufacturing, and in particular, to methods for preparing optical ink, methods for preparing a monodisperse solution of zirconium dioxide, and display devices.

INTRODUCTION

This section provides background information related to the present disclosure which is not necessarily prior art.

With the development of technology of preparing a display panel, higher requirements for display effects and comprehensive performance of a display panel and a display device are presented.

In a display panel such as an organic light-emitting diode (OLED) display panel, a light-emitting diode (LED) display panel or the like, a related optical film layer is generally provided over a device to improve efficiency of extraction of internal light or to reduce reflection of external ambient light. The functional optical film usually uses material with high refractive index or low refractive index to adjust an optical path. In this regard, an inorganic nano metal oxide/polymer composite system is widely used in high or low refractive optical materials. In the related art, representative materials of inorganic nano metal oxide mainly comprise nano zirconium dioxide, nano silicon dioxide, nano titanium dioxide, and the like, which are widely used in preparation of the display panels. During the preparation, zirconium dioxide or the like is generally dispersed in a polymer system to obtain ink material with a different refractive index. The key technology for preparing the ink relates to dispersion of inorganic nano particles. In order to obtain a transparent, uniform and stable dispersion solution, agglomeration of the inorganic nano particles must be avoided. Taking zirconium dioxide as an example, most of the preparation methods may go through a high-temperature calcination process among others. This may reduce reactive sites or functional groups such as hydroxyl groups on the surface of zirconium oxide, resulting in easy agglomeration of nano particles and thus making it difficult to obtain a monodisperse system of nano zirconium oxide.

Therefore, in the related art, when the ink on the optical film layer is prepared, the corresponding nano metal oxide in the ink has fewer reactive sites and thus the nano particles may be easily agglomerated, thereby reducing optical performance of the optical film layer, which is not conducive to improvement of the comprehensive performance of the display panel.

SUMMARY

Embodiments of the present disclosure provides methods for preparing optical ink, methods for preparing a monodisperse solution of zirconium dioxide, and display devices, which can effectively improve optical performance of an optical film layer and improve comprehensive performance of a display panel and a display device.

A first aspect of embodiments of the present disclosure provides a method for preparing a monodisperse solution of zirconium dioxide, comprising steps of:

S100, providing a zirconium oxychloride solution, and adding sodium hydroxide to the zirconium oxychloride solution to obtain a first solution;

S101, transferring the first solution to a first reaction condition and reacting to obtain a second solution; wherein reaction is carried out under protection of a liquid atmosphere in the first reaction condition;

S102, taking out the second solution and cooling to room temperature to obtain a zirconium dioxide sol;

S103: adding cyclohexane to the zirconium dioxide sol, standing for a while to obtain a solution, and adding isopropanol to the solution after standing to obtain a third solution;

S104, separating the third solution to obtain a zirconium oxide precipitate;

S105, taking a certain amount of the zirconium oxide precipitate, and adding the zirconium oxide precipitate to a first medium for dispersion to obtain a dispersion solution, then adding an acidic regulator to the dispersion solution to obtain a fifth solution; and S106, adding a silane coupling agent to the fifth solution and stirring, and then standing for a while to obtain a monodisperse solution of nano zirconium dioxide.

According to an embodiment of the present disclosure, a molar ratio of the zirconium oxychloride to the sodium hydroxide is 1:1, and in the first reaction condition, a reaction temperature ranges from 100° C. to 400° C. and a reaction pressure ranges from 1 MPa to 5 MPa.

According to an embodiment of the present disclosure, in the step S103, 1 ml to 5 ml of cyclohexane is added to 5 ml of the zirconium dioxide sol, and an amount of the isopropanol added is 1 ml to 20 ml.

According to an embodiment of the present disclosure, the isopropanol is dropped into a mixed solution of the zirconium dioxide and the cyclohexane at normal temperature during the process of adding the isopropanol.

According to an embodiment of the present disclosure, the third solution is transferred to a centrifuge and centrifuged at a rotational speed of at least 10000 rpm/min for 5 minutes to obtain a white zirconium oxide precipitate during the process of separating the third solution.

According to an embodiment of the present disclosure, in the step S105, the first medium is an ethanol solution, and the zirconium oxide precipitate is added to the ethanol solution in such a manner that a mass fraction of the zirconium oxychloride in the mixed solution is 1% to 50% during the process of adding the zirconium oxide precipitate to the ethanol solution.

According to an embodiment of the present disclosure, the acidic regulator comprises any one of acetic acid and adipic acid, and after adjustment, a pH value of the fifth solution obtained is 3 to 5.

According to an embodiment of the present disclosure, the step S106, the silane coupling agent comprises any one of γ-(2,3-epoxypropoxy) propytrimethosysilane, γ-methacryloxy propyl trimethoxy silane, and dodecyltrimethoxysilane.

According to an embodiment of the present disclosure, in the step S105, the first medium is an acrylate solution, and the dispersion is performed by stirring or ultrasonic dispersion for a dispersion time of 0.5 min to 5 min.

According to an embodiment of the present disclosure, there is also provided a method for preparing an optical ink, comprising steps of:

S201, providing a monodisperse solution of zirconium dioxide, wherein the a monodisperse solution of zirconium dioxide is prepared by the method provided in embodiments of the present disclosure; and S202, adding a monomer, a photoinitiator, a solvent, and a functional additive to the monodisperse solution of zirconium dioxide, thus obtaining the optical ink.

According to an embodiment of the present disclosure, in the step S202:

the monomer comprises any one of acrylic acid and epoxy resin;

the photoinitiator comprises any one of dibenzoyl peroxide, diphenyl (2,4,6-trimethylbenzoyl) phosphine oxide, and diphenyl (2,4,6-triformyl) phosphine oxide;

the solvent comprises any one of an ester and a ketone solvent; and the functional additive comprises any one of a leveling agent and a surfactant.

According to an embodiment of the present disclosure, a ratio of a mass fraction of the monomer, the photoinitiator, the solvent, and the functional additive in the optical ink is (10% to 50%):(1% to 10%):(30% to 70%):(0.1% to 5%).

According to an embodiment of the present disclosure, in the step S204, the first medium is an acrylate solution, and the dispersion is performed by stirring or ultrasonic dispersion for a dispersion time of 0.5 min to 5 min.

According to a third aspect of embodiments of the present disclosure, there is further provided an optical ink comprising:

a nano zirconium dioxide dispersion solution, and a monomer, a photoinitiator, a solvent, and a functional additive dissolved in the nano zirconium dioxide disperse solution;

wherein a ratio of a mass fraction of the monomer, the photoinitiator, the solvent, and the functional additive in the optical ink is (10% to 50%):(1% to 10%):(30% to 70%):(0.1% to 5%), and the optical ink has a pH value of 3 to 10.

According to an embodiment of the present disclosure, the monomer comprises any one of acrylic acid and epoxy resin;

the photoinitiator comprises any one of dibenzoyl peroxide, diphenyl (2,4,6-trimethylbenzoyl) phosphine oxide, and diphenyl (2,4,6-triformyl) phosphine oxide;

the solvent comprises any one of an ester and a ketone solvent; and the functional additive comprises any one of a leveling agent and a surfactant.

According to a fourth aspect of embodiments of the present disclosure, there is further provided a display device comprising:

a light-transmitting layer for transmitting light; and an optical ink layer disposed on the light-transmitting layer, and the optical ink layer is used to improve an extraction efficiency of light inside the display device or reduce reflection of external ambient light;

wherein the optical ink layer is prepared by using the method provided in embodiments of the present disclosure.

DRAWINGS

FIG. 1 is a schematic structural diagram of a display device according to an embodiment of the present disclosure.

FIG. 2 is a schematic flowchart of a process for preparing a monodisperse solution of zirconium dioxide according to an embodiment of the present disclosure.

DETAILED DESCRIPTION

Hereinafter, the following disclosure provides different implementations or examples to implement different structures of the present disclosure with reference to the accompanying drawings in embodiments of the present disclosure. In order to simplify the present disclosure, components and arrangements of specific examples are described below. In addition, examples of various specific processes and materials provided by the present disclosure are applications of other processes that a person skilled in the art can realize. All the other embodiments, obtained by a person with ordinary skill in the art without expenditure of creative labor, belong to the protection scope of the present disclosure.

In description of the present application, the terms "center", "longitudinal", "transverse", "length", "width", "thickness", "up", "down", "front", "back", "left", "right", "vertical", "horizontal", "top", "bottom", "inner", "outer", "clockwise", "counterclockwise", and the like that indicating an orientation or a positional relationship are based on an orientation or a positional relationship shown in the accompanying drawings, which are merely intended to facilitate the description of the present disclosure and simplify the description, and are not intended to indicate or imply that a device or an element must have a specific orientation, be constructed and operated in a specific orientation, and therefore cannot be construed as a limitation of the present application. In addition, the terms "first", "second" are used for descriptive purposes only and cannot be understood as indicating or implying relative importance or implicitly indicating the number of indicated technical features.

With continuous development of technology of preparing the display panel, people have put forward higher requirements on performance and display effects of the display panel and the display device.

The performance of a display device is closely related to the performance of its internal devices. For example, high or low refractive index of each optical film in the display panel will affect the performance of the panel to varying degrees. However, the performance of the optical film layer prepared in the related art cannot meet an optimal use requirement, for example, the refractive index of the prepared optical film layer cannot meet the use requirement, which is not conducive to further improvement of the comprehensive performance of the display panel and display device.

Figure 1:
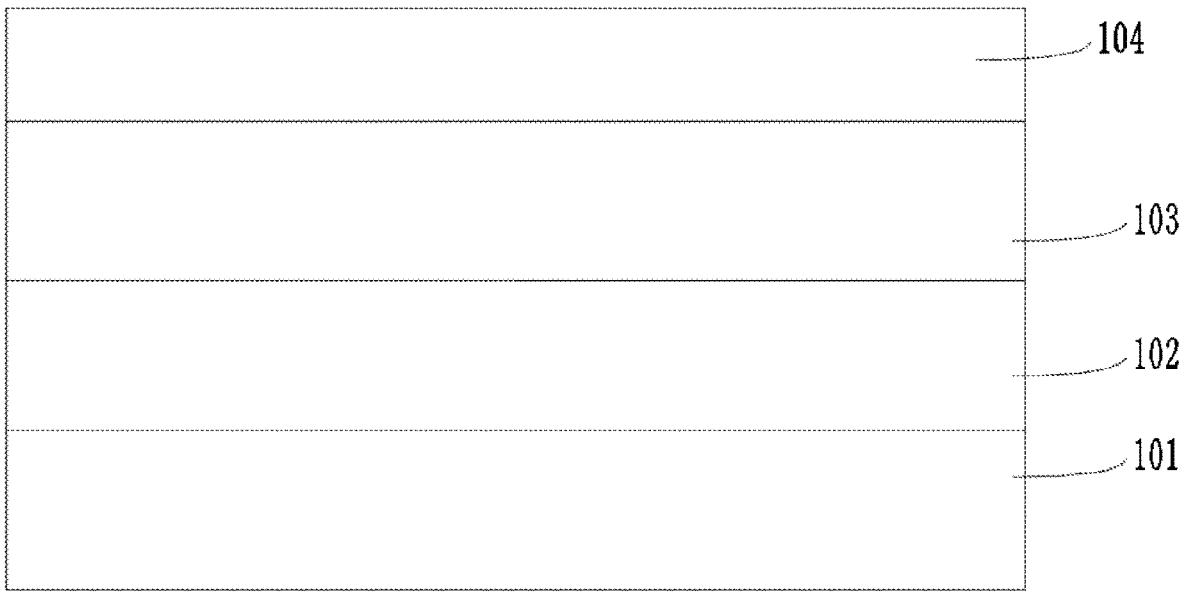

Embodiments of the present disclosure provide an optical ink and a preparation method thereof, a method for preparing zirconium dioxide, and a display device, so as to effectively improve comprehensive performance of a display panel and a device As shown in FIG. 1, which is a schematic structural diagram of a display device according to an embodiment of the present disclosure. The display device comprises a substrate 101, a light-emitting layer 102, a light-transmitting layer 103 and an optical ink layer 104.

Specifically, the light-emitting layer 102 is disposed on the substrate 101, the light-transmitting layer 103 is disposed on the light-emitting layer 102, and meanwhile the optical ink layer 104 is disposed on the light-transmitting layer 103.

In embodiments of the present disclosure, the substrate 101 may be a glass substrate or a flexible substrate, such as a flexible material like polyimide. The light-emitting layer 102 may comprise light-emitting layers of different colors, such as red, blue, and green. Therefore, color display of the display panel is realized.

Further, the optical ink layer 104 may be disposed directly on the corresponding light-transmitting layer 103, or the optical ink layer 104 may be disposed on other functional film layers, for example, a structure such as a filter or a polarizer layer may be further disposed between the optical ink layer 104 and the light-emitting layer 102. In embodiments of the present disclosure, the light-transmitting layer 103 may be provided as an optical film layer such as an anti-reflective layer, and the optical ink layer 104 may be disposed on an optical filter or a polarizer layer. The particular location is not limited. In embodiments of the present disclosure, the optical ink layer 104 can effectively improve light output rate of light in the display panel or reduce reflection of light in the external environment. Therefore, the comprehensive performance of the display panel and the display device is improved.

Specifically, in embodiments of the present disclosure, the optical ink layer 104 may be a transparent optical ink layer, thereby ensuring light propagation effects. Alternatively, the optical ink layer 104 may be provided as an optical layer of other colors as desired to propagate light. Meanwhile, the refractive index corresponding to the optical ink layer 104 is 1.55 to 1.75. Therefore, the refractive index of the film layer penetrated by light is effectively improved.

In embodiments of the present disclosure, in the process of preparing the optical ink layer 104, the surface of the corresponding nano metal oxide particles has a higher activity, thereby effectively ensuring the optical performance of the optical ink layer 104.

Embodiments of the present disclosure provide a method for preparing the above optical ink layer. The optical ink layer is formed by curing the above prepared optical ink, and the optical ink is prepared by multi-step reactions.

Specifically, the optical ink mainly contains a nano oxide, which mainly comprises materials such as zirconium dioxide, silicon dioxide, and titanium dioxide, while the optical ink corresponding to the zirconium dioxide has better performance. Therefore, in the following embodiments, the optical ink is illustrated by taking nano zirconium dioxide as an example.

During the preparation, firstly, a method for preparing a monodisperse solution of zirconium dioxide is provided. As shown in FIG. 2, which is a schematic flowchart of a process for preparing a monodisperse solution of zirconium dioxide according to an embodiment of the present disclosure. Steps of preparing the zirconium dioxide comprise:

S100, providing a zirconium oxychloride solution, and adding sodium hydroxide to the zirconium oxychloride solution to obtain a first solution;

S101, transferring the first solution to a first reaction condition and reacting to obtain a second solution; wherein reaction is carried out under protection of a liquid atmosphere in the first reaction condition;

S102, taking out the second solution and cooling to room temperature to obtain a zirconium dioxide sol;

S103: adding cyclohexane to the zirconium dioxide sol, standing for a while to obtain a solution, and adding isopropanol to the solution after standing to obtain a third solution;

S104, separating the third solution to obtain a zirconium oxide precipitate;

S105, taking a certain amount of the zirconium oxide precipitate, and adding the zirconium oxide precipitate to a first medium for dispersion, then adding an acidic regulator to the dispersion solution to obtain a fifth solution; and S106, adding a silane coupling agent to the fifth solution, and stirring, and then standing for a while to obtain a monodisperse solution of nano zirconium dioxide.

Specifically, in order to prepare the optical ink, it is necessary to first prepare a monodisperse solution of the zirconium dioxide.

In embodiments of the present disclosure, a monodisperse solution of the above-mentioned zirconium dioxide is prepared in an aqueous solution. Specifically, providing a zirconium oxychloride solution firstly, and then adding sodium hydroxide to the zirconium oxychloride solution, thus obtaining a first solution after mixing and reacting them.

In embodiments of the present disclosure, the above-mentioned zirconium oxychloride and sodium hydroxide are mixed in a molar ratio of 1:1, so that they are fully reacted.

At this time, the first solution obtained above is further processed by transferring the first solution to the first reaction condition to continue the reaction. In embodiments of the present disclosure, the first solution may be transferred to a hydrothermal reactor, and the reaction can be protected by liquid. The hydrothermal reactor can provide a higher temperature and pressure for the reaction, thereby promoting the reaction and protecting the zirconium oxychloride.

Specifically, the corresponding reaction temperature in the hydrothermal reactor ranges from 100° C. to 400° C., and the corresponding reaction pressure ranges from 1 MPa to 5 MPa. The first solution is processed in a hydrothermal reactor for 1 h to 72 h. The reaction temperature in the hydrothermal reactor is 280° C., the reaction pressure is 3 MPa, and the reaction in the hydrothermal reactor is carried out for 8 h.

After the reaction is completed, taking the first solution out from the hydrothermal reactor, and cooling to room temperature to obtain an aqueous solution of zirconium dioxide. In embodiments of the present disclosure, the aqueous solution of zirconium dioxide is a hydrosol of nano particles. Moreover, during the reaction, the liquid environment of the hydrothermal reactor can effectively protect zirconium dioxide in the first solution, thereby avoiding reduction of surface activity of the nano particles formed thereby.

After the preparation is completed, a zirconium dioxide sol is obtained for later use.

Specifically, the preparation is carried out on the basis of the above-mentioned zirconium dioxide sol. An amount of the hydrosol of nano zirconium dioxide is taken and an amount of cyclohexane is added thereto to obtain a mixed solution. The mixed solution is allowed to stand, so that the above mixed solution is layered, then isopropanol is continuously added until white flocs appear in the mixed solution. After the addition is complete, a third solution is obtained.

In embodiments of the present disclosure, when adding the above materials, 1 ml to 5 ml of cyclohexane is added to 5 ml of the zirconium dioxide sol, and an amount of the isopropanol added is 1 ml to 20 ml.

Meanwhile, the isopropanol is dropped into a mixed solution of the zirconium dioxide and the cyclohexane at normal temperature during the process of adding the iso-propanol.

Continuing to process the above-mentioned third solution, and separating the white flocs from the third solution. Specifically, the separation can be performed through a centrifuge. The third solution is transferred to a centrifuge and centrifuged at a rotational speed of at least 10000 rpm/min for 5 minutes to obtain a white precipitate, which is a zirconium oxide precipitate.

Further, continuing to process the above-mentioned zir-conium oxide precipitate. In embodiments of the present disclosure, a mass of zirconium oxychloride solid is weighed and added to a first medium. In embodiments of the present disclosure, the first medium may be a mixed solution or a monomer substance. The subsequent preparation pro-cess is carried out by dispersing the zirconium oxychloride solid in a solution or a monomer.

In the following embodiments, when the first medium is a mixed solution, an ethanol solution is taken as an example. When the first medium is a monomer substance, and the monomer is described by taking acrylate as an example.

Specifically, when the first medium is ethanol, a certain amount of zirconium oxychloride solid is taken and added to the ethanol, and stirred for 1 min to 10 min, so that the solid can be rapidly and sufficiently dissolved and dispersed. After dissolution is completed, the mass fraction of the zirconium oxychloride in the dispersion solution is 1% to 50%, and preferably, the mass fraction of the zirconium oxychloride can be set to 10%.

After the dissolution is completed, an acidic regulator is added to the above-mentioned dispersion solution to adjust pH of the dispersion solution.

Figures 3, 4:
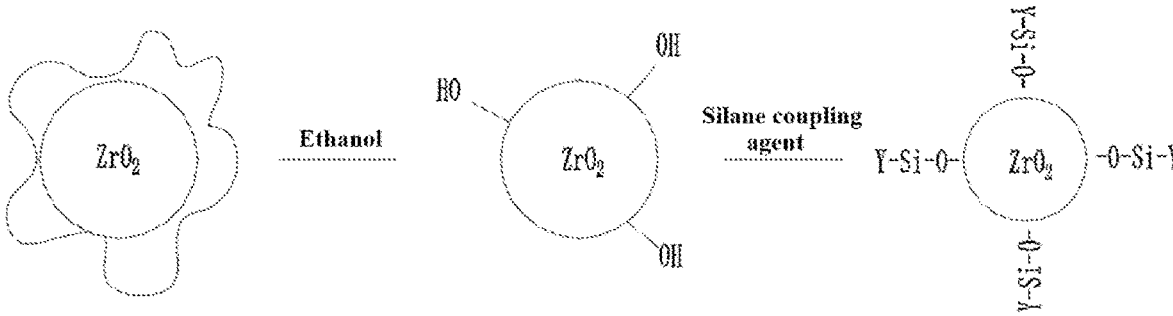
FIG. 3 is a schematic flowchart of a method for preparing optical ink according to an embodiment of the present disclosure.
FIG. 4 is a schematic diagram of surface modification of nano particles during reaction according to an embodiment of the present disclosure.

As shown in FIG. 4, which is a schematic diagram of surface modification of nano particles during reaction according to an embodiment of the present disclosure. During the reaction, the alkoxy groups in the silane coupling agent coordinate with the hydroxyl groups on the surface of zirconium oxychloride, thereby modifying properties of the nano particles, and effectively improving its performance. Meanwhile, in embodiments of the present disclosure, the whole reaction is carried out in a liquid, which can further protect the surface of the modified nano particles and improve their performance.

In embodiments of the present disclosure, the acidic regulator comprises any one of acetic acid and adipic acid. Preferably, acetic acid is added to the above dispersion solution to adjust the pH of the dispersion solution within a range of 3 to 5. After the process is completed, a fifth solution is obtained.

Further, a silane coupling agent is added to the fifth solution, and the silane coupling agent may be added in an amount according to the amount of the fifth solution. Mean-while, during the addition, stirring is carried out, preferably magnetic stirring may be adopted to further enhance the mixing effect. At the same time, the stirring is fully carried out under a temperature of 50° C. to 90° C. for at least 0.5 h to 5 h to fully carry out the reaction.

In embodiments of the present disclosure, the silane coupling agent comprises any one of γ-(2,3-epoxypropoxy) propytrimethosysilane, γ-methacryloxy propyl trimethoxy silane, and dodecyltrimethoxysilane. The performance of the nano particles is further enhanced by the silane coupling agent.

After the addition and stirring are completed, the above solution is allowed to stand for a period of time, then the solution changes from a white dispersion solution to a clear and transparent solution. In embodiments of the present disclosure, the clear and transparent solution is a nano zirconium dioxide dispersion solution. The nano zirconium dioxide can be modified through the above-mentioned dif-ferent steps, so as to effectively improve the surface activity of the nano zirconium dioxide particles.

Further, as shown in FIG. 3, which is a method for preparing an optical ink according to an embodiment of the present disclosure comprising steps of:

S201, providing a monodisperse solution of zirconium dioxide, wherein the a monodisperse solution of zirco-nium dioxide is prepared by the method provided in embodiments of the present disclosure; and S202, adding a monomer, a photoinitiator, a solvent, and a functional additive to the monodisperse solution of zirconium dioxide, thus obtaining the optical ink.

Continuing to process the above-mentioned nano zirco-nium dioxide dispersion solution. Specifically, adding a monomer, a photoinitiator, a solvent, and a functional addi-tive to a certain amount of the above-mentioned dispersion solution to obtain an optical ink of the required specification after the above-mentioned materials are thoroughly mixed.

In embodiments of the present disclosure, a ratio of a mass fraction of the monomer, the photoinitiator, the sol-vent, and the functional additive in the above-mentioned dispersion solution is (10% to 50%):(1% to 10%):(30% to 70%):(0.1% to 5%). Preferably, in embodiments of the present disclosure, in the zirconium dioxide dispersion solu-tion, the mass fraction of the monomer is 15%, the mass fraction of the photoinitiator is 5%, the mass fraction of the solvent is 40%, and the mass fraction of the functional additive is 2%.

Further, the monomer comprises any one of acrylic acid and epoxy resin; the photoinitiator comprises any one of dibenzoyl peroxide, diphenyl (2,4,6-trimethylbenzoyl) phosphine oxide, and diphenyl (2,4,6-triformyl) phosphine oxide; the solvent comprises any one of an ester and a ketone solvent; and the functional additive comprises any one of a leveling agent and a surfactant. The above-mentioned mate-rials are added according to the proportion in embodiments of the present disclosure to finally obtain the optical ink provided in embodiments of the present disclosure. In embodiments of the present disclosure, a corresponding pH value of the optical ink is 3 to 10, so that the above materials can be well mixed.

In embodiments of the present disclosure, the zirconium oxychloride nano particles obtained by the above-mentioned process are not easy to agglomerate again, and the reactivity corresponding to the surface of the zirconia nano particles is high, thereby effectively improving performance of the optical film layer prepared by the zirconia nano particles.

Further, in the step S105, when the first medium is an acrylate monomer, the zirconium oxychloride solid is dis-solved in the acrylate monomer, and fully stirred or ultra-sonically dispersed to completely dissolve the zirconium oxychloride solid, wherein the dispersion is carried out for 0.5 min to 5 min.

In embodiments of the present disclosure, the acrylate is mainly a photocurable material, and therefore, an optical ink can be obtained by using the acrylate as a dispersion medium. Therefore, after the above optical ink is prepared, is can be further used to prepare the optical ink layer provided in embodiments of the present disclosure. Specifi-cally, the prepared optical ink may be coated on a substrate or other optical film layers, and then irradiated with light to cure the optical ink, thereby improving the processing process of the optical ink and the optical ink layer, and finally obtaining the optical ink in embodiments of the present disclosure.

In embodiments of the present disclosure, the optical ink layer can be applied to a display panel or a display device formed of a plurality of optical film layers. The display panel may be any device having a display function and an optical effect, such as a mobile phone, a computer, an electronic paper, a display, a notebook computer, or a digital photo frame, and the specific type of which is not specifically limited.

Compared with the related art, embodiments of the present disclosure provide methods for preparing an optical ink and methods for preparing a monodisperse solution of zirconium dioxide, and display devices. When preparing the optical ink, a corresponding zirconium dioxide hydrosol is prepared by an aqueous solution method, and reactants are continuously added to the zirconium dioxide hydrosol to continue multi-step reactions, so that a transparent modified nano zirconium dioxide dispersion solution is finally obtained, and then a monomer, a photoinitiator, a solvent, and a functional additive thereof are added to the nano zirconium dioxide dispersion solution to form an optical ink of the desired specification. In embodiments of the present disclosure, the whole preparation process is carried out directly in a liquid environment without high-temperature treatment, so that activity of the prepared nano particles on the surface of the nano zirconium dioxide is effectively ensured, and the comprehensive performance of the optical film corresponding to the optical ink is effectively improved In view of the foregoing, the optical ink and a preparation method thereof, a method for preparing a monodisperse solution of zirconium dioxide, and a display device provided in embodiments of the present disclosure have been described in detail above, and the principles and embodiments of the present disclosure are described by using specific examples herein. Descriptions of the above embodiments are merely intended to help understand the technical solutions and core ideas of the present disclosure. Although the present disclosure has been described in terms of preferred embodiments, the above preferred embodiments are not intended to limit the present disclosure. A person skilled in the art can make various changes and modifications without departing from the spirit and scope of the present disclosure. Therefore, the scope of protection of the present disclosure is based on the scope limited by the claims.

What is claimed is:

1. A method for preparing a monodisperse solution of nano zirconium dioxide, comprising steps of:
   a), providing a zirconium oxychloride solution, and adding sodium hydroxide to the zirconium oxychloride solution to obtain a first solution;
   b), transferring the first solution to a first reaction condition where the first solution reacts under protection of a liquid atmosphere to obtain a second solution;
   c), taking out the second solution for restoring to room temperature to obtain a nano zirconium dioxide sol;
   d), resting the nano zirconium dioxide sol after adding cyclohexane to the nano zirconium dioxide sol, and adding isopropanol to the rested nano zirconium dioxide sol to obtain a third solution;
   e), separating the third solution to obtain a zirconium oxide precipitate;
   f), adding an amount of the zirconium oxide precipitate to a first medium for dispersion to obtain a dispersion solution, and adding an acidic regulator to the dispersion solution to obtain a fifth solution; and
   g), stirring the fifth solution after adding silane coupling agent to the fifth solution, and then resting the stirred fifth solution to obtain the monodisperse solution of nano zirconium dioxide;
   wherein a molar ratio of the zirconium oxychloride to the sodium hydroxide is 1:1, and in the first reaction condition a reaction temperature ranges from 100° C. to 400° C. and a reaction pressure ranges from 1 MPa to 5 MPa.

2. The method for preparing a monodisperse solution of nano zirconium dioxide according to claim 1, wherein, in the step d), 1 ml to 5 ml of the cyclohexane is added to 5 ml of the nano zirconium dioxide sol, and 1 ml to 20 ml of the isopropanol is added.

3. The method for preparing a monodisperse solution of nano zirconium dioxide according to claim 2, wherein the adding of the isopropanol comprises: dropping the isopropanol into a mixed solution of the nano zirconium dioxide and the cyclohexane at the room temperature.

4. The method for preparing a monodisperse solution of nano zirconium dioxide according to claim 1, wherein the separating of the third solution comprises: transferring the third solution to a centrifuge for centrifuging at a rotational speed of at least 10000 rmp/min for 5 minutes to obtain a white zirconium oxide precipitate.

5. The method for preparing a monodisperse solution of nano zirconium dioxide according to claim 1, wherein, in the step f), the first medium is an ethanol solution, and the zirconium oxide precipitate is added to the ethanol solution so that a mass fraction of the zirconium oxide in the obtained dispersion solution ranges from 1% to 50%.

6. The method for preparing a monodisperse solution of nano zirconium dioxide according to claim 1, wherein the acidic regulator comprises any one of acetic acid and adipic acid, and a pH value of the obtained fifth solution ranges from 3 to 5.

7. The method for preparing a monodisperse solution of nano zirconium dioxide according to claim 1, wherein, the silane coupling agent comprises any one of γ-(2,3-epoxy-propoxy) propytrimethosysilane, γ-methacryloxy propyl trimethoxy silane, and dodecyltrimethoxysilane.

8. The method for preparing a monodisperse solution of nano zirconium dioxide according to claim 1, wherein, in the step f), the first medium is an acrylate solution, and the dispersion is performed by stirring or ultrasonic dispersion for 0.5 min to 5 min.

9. A method for preparing a monodisperse solution of nano zirconium dioxide, comprising steps of:
   a), providing a zirconium oxychloride solution, and adding sodium hydroxide to the zirconium oxychloride solution to obtain a first solution;
   b), transferring the first solution to a first reaction condition where the first solution reacts under protection of a liquid atmosphere to obtain a second solution;
   c), taking out the second solution for restoring to room temperature to obtain a nano zirconium dioxide sol;
   d), resting the nano zirconium dioxide sol after adding cyclohexane to the nano zirconium dioxide sol, and adding isopropanol to the rested nano zirconium dioxide sol to obtain a third solution;
   e), separating the third solution to obtain a zirconium oxide precipitate;
   f), adding an amount of the zirconium oxide precipitate to a first medium for dispersion to obtain a dispersion solution, and adding an acidic regulator to the dispersion solution to obtain a fifth solution; and g), stirring the fifth solution after adding silane coupling agent to the fifth solution, and then resting the stirred fifth solution to obtain the monodisperse solution of nano zirconium dioxide;

wherein, in the step d), 1 ml to 5 ml of the cyclohexane is added to 5 ml of the nano zirconium dioxide sol, and 1 ml to 20 ml of the isopropanol is added.

10. The method for preparing a monodisperse solution of nano zirconium dioxide according to claim 9, wherein a molar ratio of the zirconium oxychloride to the sodium hydroxide is 1:1, and in the first reaction condition a reaction temperature ranges from 100° C. to 400° C. and a reaction pressure ranges from 1 MPa to 5 MPa.

11. The method for preparing a monodisperse solution of nano zirconium dioxide according to claim 9, wherein the adding of the isopropanol comprises: dropping the isopropanol into a mixed solution of the nano zirconium dioxide and the cyclohexane at the room temperature.

12. The method for preparing a monodisperse solution of nano zirconium dioxide according to claim 9, wherein the separating of the third solution comprises: transferring the third solution to a centrifuge for centrifuging at a rotational speed of at least 10000 rmp/min for 5 minutes to obtain a white zirconium oxide precipitate.

13. The method for preparing a monodisperse solution of nano zirconium dioxide according to claim 9, wherein, in the step f), the first medium is an ethanol solution, and the zirconium oxide precipitate is added to the ethanol solution so that a mass fraction of the zirconium oxide in the obtained dispersion solution ranges from 1% to 50%.

* * * * *